(12) United States Patent
Shida et al.

(10) Patent No.: US 8,461,755 B2
(45) Date of Patent: Jun. 11, 2013

(54) LIGHT SOURCE FOR LIGHTING

(75) Inventors: Satoshi Shida, Osaka (JP); Kenzi Takahashi, Osaka (JP); Mitsuhito Miyazaki, Osaka (JP)

(73) Assignee: Panasonic Corporation, Osaka (JP)

( * ) Notice: Subject to any disclaimer, the term of this patent is extended or adjusted under 35 U.S.C. 154(b) by 201 days.

(21) Appl. No.: 13/002,034

(22) PCT Filed: Jul. 29, 2009

(86) PCT No.: PCT/JP2009/003567
§ 371 (c)(1),
(2), (4) Date: Dec. 29, 2010

(87) PCT Pub. No.: WO2010/021089
PCT Pub. Date: Feb. 25, 2010

(65) Prior Publication Data
US 2011/0149577 A1 Jun. 23, 2011

(30) Foreign Application Priority Data
Aug. 21, 2008 (JP) ................................. 2008-213076

(51) Int. Cl.
*H01J 63/04* (2006.01)
(52) U.S. Cl.
USPC ............ 313/501; 313/506; 313/507; 313/512

(58) Field of Classification Search
USPC .................................. 313/501, 506, 507, 512
See application file for complete search history.

(56) References Cited

U.S. PATENT DOCUMENTS 5,857,767 A * 1/1999 Hochstein ..................... 362/294
2008/0186704 A1* 8/2008 Chou et al. .................... 362/249

FOREIGN PATENT DOCUMENTS

| JP | 2003-277479 | 10/2003 |
| JP | 2006-332382 | 12/2006 |
| JP | 2007-27433 | 2/2007 |
| JP | 2007-59260 | 3/2007 |
| JP | 2008-171931 | 7/2008 |

OTHER PUBLICATIONS

English Translation of JP2006-332382, published Dec. 7, 2006.*

* cited by examiner

*Primary Examiner* — Mary Ellen Bowman

(57) ABSTRACT

A light source used for illumination provides favorable heat dissipation properties while suppressing the lowering of the efficiency of light emission. The light source includes a mount substrate, an LED 23 mounted on the mount substrate and a silicon resin mold containing phosphor particles that convert the wavelength of light emitted from the LED 25. The mount substrate includes a metal substrate 23 coated with a ceramic layer 24 containing light-transmissive or highly reflective ceramic particles.

15 Claims, 16 Drawing Sheets

| Reflective material | | Spectral reflectance (460nm) | | |
|---|---|---|---|---|
| | | Initial period | After thermally deteriorated | |
| Ceramics | Alumina | Approx. 83% | Approx. 83% (180°C/1h) | Approx. 83% (215°C/1h) |
| Epoxy resin | White resist (PSR-4000 LEW1) | Approx. 77% | Approx. 60% (150°C/1000h) | |
| BT | White color (CCL-L820WDI) | Approx. 87% | Approx. 78% (180°C/1h) | Approx. 58% (215°C/1h) |
| Al (A5052) | Without surface roughness | Approx. 67% | | |
| | With surface roughness | Approx. 77% | | |
| Ag coating | Cu-Ni-Ag | Approx. 80% | Approx. 58% (140°C/260h) | Approx. 56% (160°C/260h) | Approx. 50% (180°C/260h) |
| | Cu-Ag | Approx. 78% | | |
| Au coating | Al-Au | Approx. 32% | | |

LIGHT SOURCE FOR LIGHTING

TECHNICAL FIELD

The present invention relates to a light source for illumination that employs a light-emitting element such as an LED, and in particular to a technique for improving the efficiency of emitting light from a light-emitting element.

BACKGROUND ART

In recent years, a technique for using a light-emitting element such as an LED as a light source for illumination has been proposed in consideration of the global environment. At present, an LED module, wherein a blue LED is mounted on amount substrate and is coated with a silicone resin containing yellow phosphors, is intended for being used as a white light source used for illumination. In most cases, a resin substrate or a ceramic substrate is used as a mount substrate for mounting thereon an LED. Either of the substrates may be used as amount substrate. However, it is desirable to use a substrate whose surface has high light reflectance in order to emit as much light from the LED as possible to the outside.

CITATION LIST

Patent Literature 1

Japanese Patent Application Publication No. 2003-277479

SUMMARY OF INVENTION

Technical Problem

However, a resin substrate is suitable for being used in a light source that emits light for a short period of time such as a flash lamp of a camera, and is unsuitable for being used in a light source for illumination that emits light for a long period of time because of the following reasons. A resin substrate has unfavorable heat dissipation properties, and the resin substrate does not sufficiently allow current to be fed to the LED. Accordingly, it is difficult for the LED to emit high-intensity light for a long period of time. Also, the surface of the resin substrate is yellowed due to the heat generated by the LED and so on. As a result, the light reflectance of the surface of the resin substrate is lowered.

On the other hand, a ceramic substrate does not have a problem as regards lowering of the light reflectance due to the heat generated by the LED and so on. However, being fragile to a mechanical shock, a ceramic substrate has a drawback that it needs to be handled with care. Also, although a ceramic substrate has higher heat dissipation properties than a resin substrate, the ceramic substrate is hardly satisfactory for being used in a light source for illumination that emits high-intensity light for a long period of time. Furthermore, a ceramic substrate costs fives times as much as a resin substrate.

To solve the above problems, it is an object of the present invention to provide a light source for illumination having favorable heat dissipation properties and maintaining favorable efficiency of light emission.

Solution to Problem

A light source for illumination in accordance with the present invention includes amount substrate including a metal substrate and a ceramic layer that coats the metal substrate, a light-emitting element mounted on the mount substrate, and a wavelength converting member operable to convert wavelength of light emitted from the light-emitting element, wherein the ceramic layer containing light-transmissive ceramic particles or highly reflective ceramic particles.

Advantageous Effects of Invention

With this structure, since a metal substrate is used as a base material thereof, the favorable heat dissipation properties can be achieved. The metal substrate is coated with a ceramic layer containing light transmissive ceramic particles or highly-reflective ceramic particles, and this ceramic layer functions as a light reflective layer. As a result, the light reflectance of the surface of the substrate is not lowered because it is not yellowed by the heat generated by the light-emitting element. Accordingly, favorable efficiency of light emission can be maintained. Furthermore, since the ceramic layer is coated on the metal substrate, insulation can be assured, and the cost of the metal substrate can be reduced to be approximately one fifth of that of a ceramic substrate.

BRIEF DESCRIPTION OF DRAWINGS

FIG. 12 is a table showing spectral reflectance of a reflective material at the initial stage and after the thermal deterioration;

DESCRIPTION OF EMBODIMENTS

The best modes for carrying out the present invention are described below in details with reference to the drawings.

[Structure]

Figure 1:
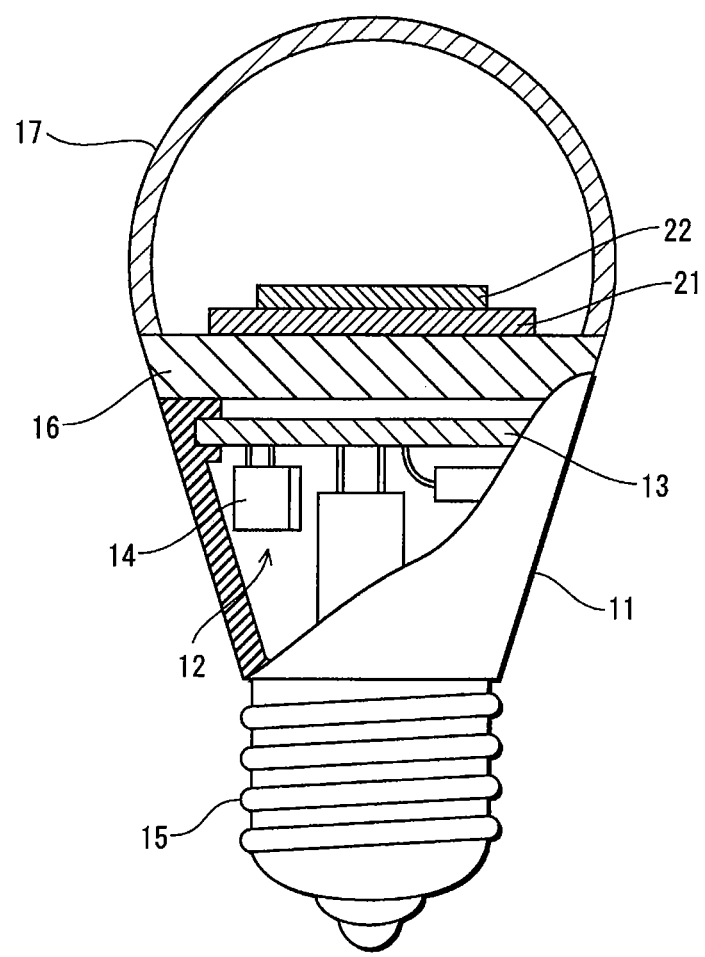
FIG. 1 shows the structure of a light source for illumination in accordance with an embodiment of the present invention.

FIG. 1 shows the structure of a light source for illumination in accordance with an embodiment of the present invention. In this embodiment, a light source for illumination that is used as a substitute for a bulb having an Edison base is described by way of example.

A light source for illumination 1 includes a case 11 having an Edison base 15 protruding therefrom, a power circuit 12 contained, in the case 11, a heat sink 16 fixed to the case 11, a mount substrate 21 disposed on the upper surface of the heat sink 16, a light emitting part 22 mounted on the upper surface of the mount substrate 21, and a globe 17 fixed to the heat sink 16 to cover a portion above the mount substrate 21. The power circuit 12 has a printed wiring board 13 and electronic components 14 mounted thereon, and has the function of supplying electric power commercially supplied via the Edison base 15 to the light-emitting part 22. The power circuit 12 and the light-emitting part 22 are electrically connected with each other via a wire led through a through-hole of the heat sink 16, for example. The heat sink 16 is obtained by anodizing aluminum, for example, and has surface contact with the mount substrate 21. The mount substrate 21 and the light-emitting part 22 constitute an LED module.

Figure 2:
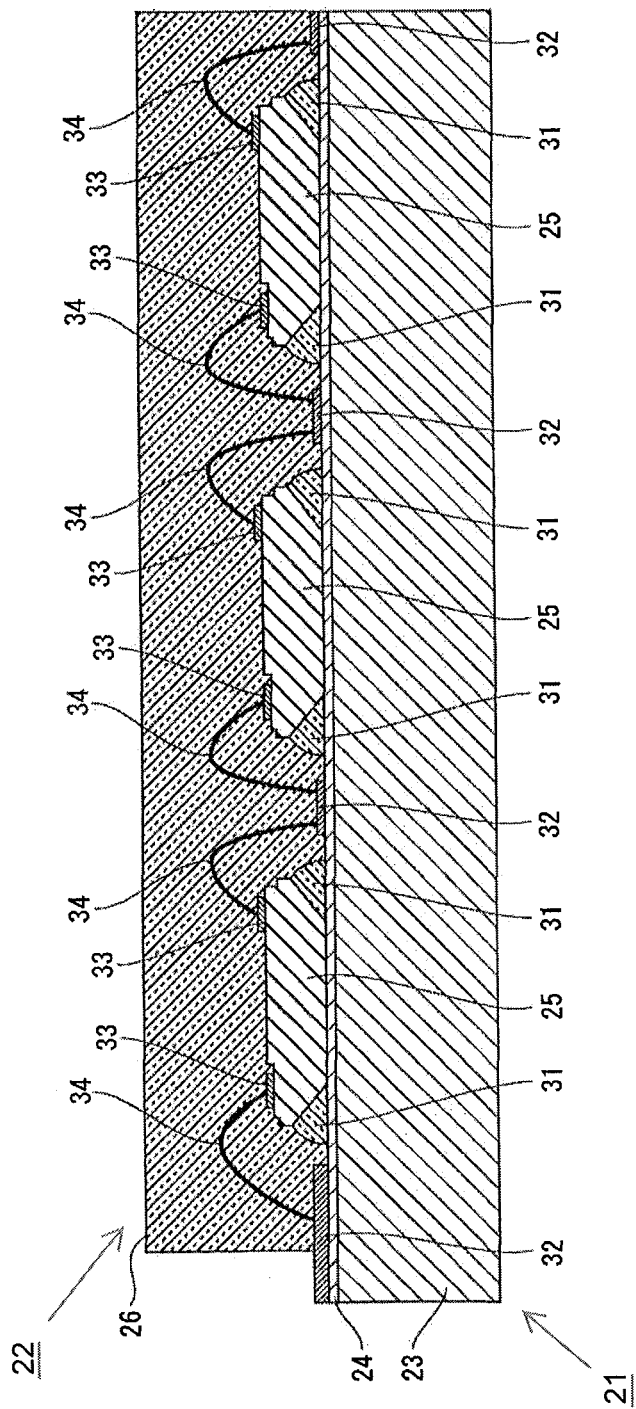
FIG. 2 is a cross-sectional view showing the structure of an LED module in accordance with the embodiment of the present invention.

FIG. 2 is a cross-sectional view showing the structure of the LED module in accordance with an embodiment of the present invention.

The mount substrate 21 includes a metal substrate 23 and a ceramic layer 24. The light-emitting part 22 includes an LED 25 that is a light-emitting element and a silicone resin mold 26 that is a wavelength converter. The LED 25 is what is called a blue LED that emits blue light (peak wavelength is approximately 460 nm±10 nm). The silicone resin mold 26 contains yellow phosphors that absorb blue light and emit yellow light. The LED 25 is disposed on the upper surface of the ceramic layer 24 and fixed by a joining member 31. Note that the LED 25 and the ceramic layer 24 may be directly in contact with each other, or that a thermally-conductive paste or the like may intervene therebetween. On the upper surface of the ceramic layer 24, in addition to the LED 25, the wiring pattern 32 is disposed. A wire 34 electrically connects the wiring pattern 32 to a pad 33 provided on the upper surface of the LED 25.

Figure 3:
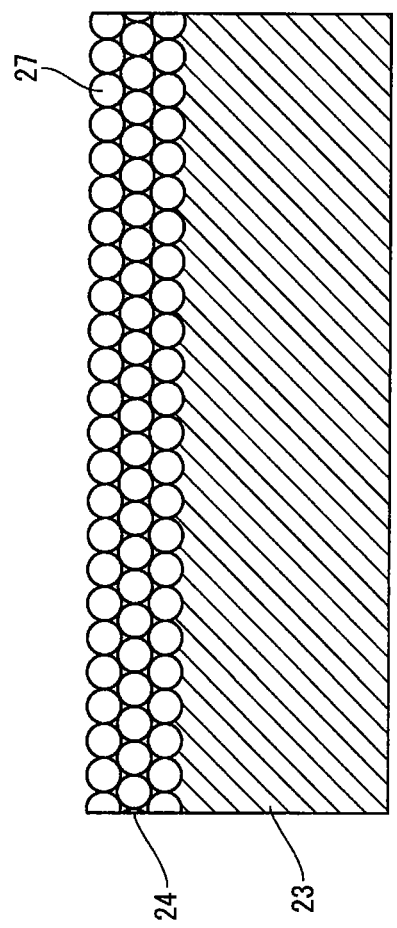
FIG. 3 is a schematic cross-sectional view magnifying a portion of amount substrate in accordance with the embodiment of the present invention.

FIG. 3 is a schematic cross-sectional view magnifying a portion of the mount substrate in accordance with an embodiment of the present invention.

The metal substrate 23 is made of, for example, a metal material such as aluminum or copper, or a composite material mainly composed of a metal material. The thickness of the metal substrate 23 ranges between 0.1 mm and 5.0 mm, inclusive.

The ceramic layer 24 is made of a collection of light-transmissive or highly reflective ceramic particles 27, and the thickness of the ceramic layer 24 ranges between 10 μm and 200 μm, inclusive. The particle diameter of a ceramic particle ranges between 0.5 μm and 50 μm, inclusive. The following oxides can be used in the light-transmissive or highly-reflective ceramic material; aluminum oxide (alumina: $Al_2O_3$), silicon oxide ($SiO_2$, SiO), tin oxide (SnO, $SnO_2$), tantalum oxide ($Ta_2O_5$), and yttrium oxide ($Y_2O_3$). Only one of them may be used, or more than one of them may be mixed and used. An individual ceramic particle 27 is transmissive to light. A collection of the ceramic particles 27 has favorable light reflective properties because of each particle's light scattering properties. Since the ceramic layer 24 is a collection of ceramic particles 27, the ceramic layer 24 has favorable reflective properties. Most of light emitted from the LED 25 toward the mount substrate 21 does not reach the metal substrate 23 and reflected by the ceramic layer 24.

Note that the metal substrate 23 and the ceramic layer 24 are bonded together not by a material such as an adhesive therebetween, but by inter-atomic force between metal atoms of the metal substrate and the ceramic particles of the ceramic layer. Such a feature can be realized by the following methods. Light-transmissive ceramic particles are thermally sprayed to the metal substrate to form a thermally-sprayed ceramic film on the surface of the metal substrate. Alternatively, in a state where a ceramic thin plate is pressure welded to a metal substrate, thermal treatment is applied at a temperature lower than the melting temperature of the metal substrate.

The above mount substrate 21 has the metal substrate 23 having high thermal conductivity as a base material thereof. Accordingly, compared with a conventional resin substrate or a conventional ceramic substrate, the mount substrate 21 has favorable heat dissipation properties. For example, the thermal conductivity of the metal substrate is 236 W/m·K (aluminum) or 390 W/m·K (copper), whereas the thermal conductivities of a conventional resin substrate and a conventional ceramic substrate are 0.5 W/m·K (BT substrate: bismaleimide·triazine) and 33 W/m·K (alumina), respectively.

According to the above mount substrate 21, the metal substrate 23 and the ceramic layer 24 are bonded together by the inter-atomic force between metal atoms of the metal substrate and the ceramic particles of the ceramic layer. Accordingly, compared with a case where the metal substrate 23 and the ceramic layer 24 are bonded together by a material such as an adhesive therebetween, the thermal resistance between the surfaces of the metal substrate 23 and the ceramic layer 24 can be lowered. Furthermore, according to the mount substrate 21, since the ceramic layer 24 having relatively low thermal conductivity is set to be thinner than the metal substrate 23 having relatively high thermal conductivity, the thermal resistance of the mount substrate 21 can be lowered as much as possible.

According to the mount substrate 21, since the ceramic layer 24 is used as a light-reflective layer, the ceramic layer 24 is not yellowed due to the heat generated by the LED 25 and the light reflectance of the ceramic layer 24 is not reduced. Thus, favorable efficiency of light emission can be maintained. Also, it is desirable that the spectral reflectance of the mount substrate 21 in the wavelength region of 460 nm±10 nm is 70% or more. The spectral reflectance of the mount substrate 21 can be realized by appropriately adjusting the thickness of the ceramic layer 24, a material of the ceramic particles 27, the particle diameter or the like. The following investigates light reflectance of the mount substrate.

[Investigation]

FIGS. 4-11 are each a graph showing the spectral reflectance of a different reflective material. FIG. 12 is a table showing the spectral reflectances of different reflective materials measured at the initial stage and after the thermal deterioration.

The reflective materials shown in FIGS. 4-11 are respectively alumina, a white resist (manufactured by Taiyo Ink Manufacturing Co., PSR-4000LEW1), a BT resin (manufactured by Mitsubishi Gas Chemical Company, Inc., CCL-L820WDI), aluminum (A5052, with no surface roughness), aluminum (A5052, with surface roughness), Ag coating (Cu—Ni—Ag), Ag coating (Cu—Ag), and Au coating (Al—

Au). Out of these reflective materials, alumina is in accordance with the embodiment of the present invention, and other reflective materials are in accordance with the comparative examples. Note that each of FIGS. 4-11 plots a plurality of data pieces. These data pieces were obtained by measuring a plurality of samples.

The table of FIG. 12 shows that the spectral reflectance (wavelength 460 nm) of alumina in accordance with the embodiment of the present invention is high at the initial stage, approximately 83%, and furthermore that the spectral reflectance is kept to be approximately 83% even after the thermal deterioration. The spectral reflectance is measured at the wavelength of 460 nm, because the peak wavelength of light emitted from the LED is in the vicinity of 460 nm. On the other hand, the BT resin in accordance with the comparative example has the highest spectral reflectance of all the reflective materials, which is approximately 87% at the initial stage, whereas after the thermal deterioration, the spectral reflectance drops to approximately 78% or as low as approximately 58%. Also, the spectral reflectance of the white resist is approximately 77% at the initial stage, whereas it drops to approximately 60% after the thermal deterioration. The spectral reflectance of the Ag coating (Cu—Ni—Ag) in accordance with the comparative example is approximately 80% at the initial stage, whereas after the thermal deterioration, it drops to approximately 58%, 56% or even drops to approximately 50%. The expression of 180° C./1 h shown in the table of FIG. 12 shows the temperature (° C.) and the time (hour) applied to the sample.

Figure 4:
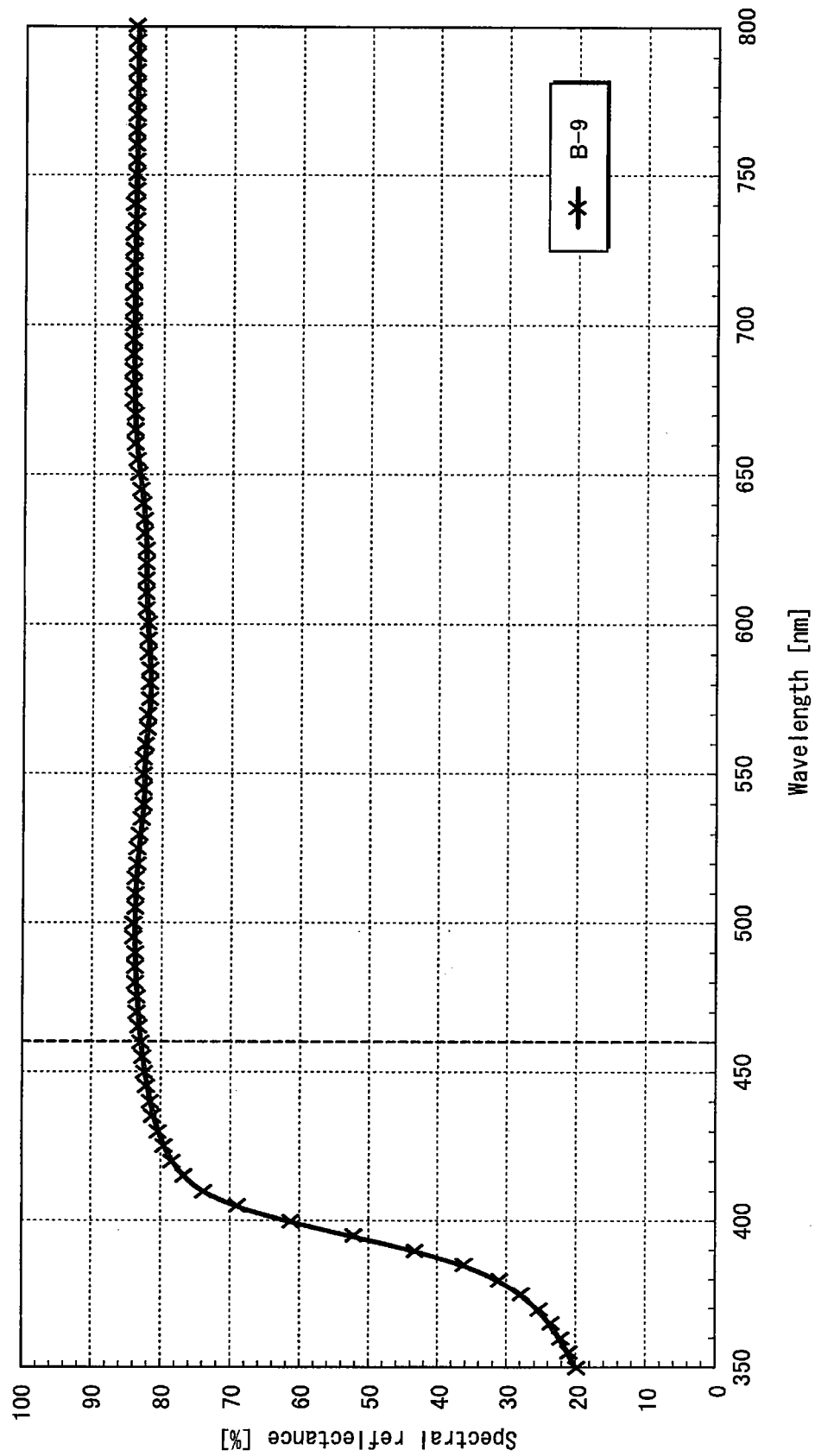
FIG. 4 is a graph showing spectral reflectance of a reflective material (alumina)
Figure 5:
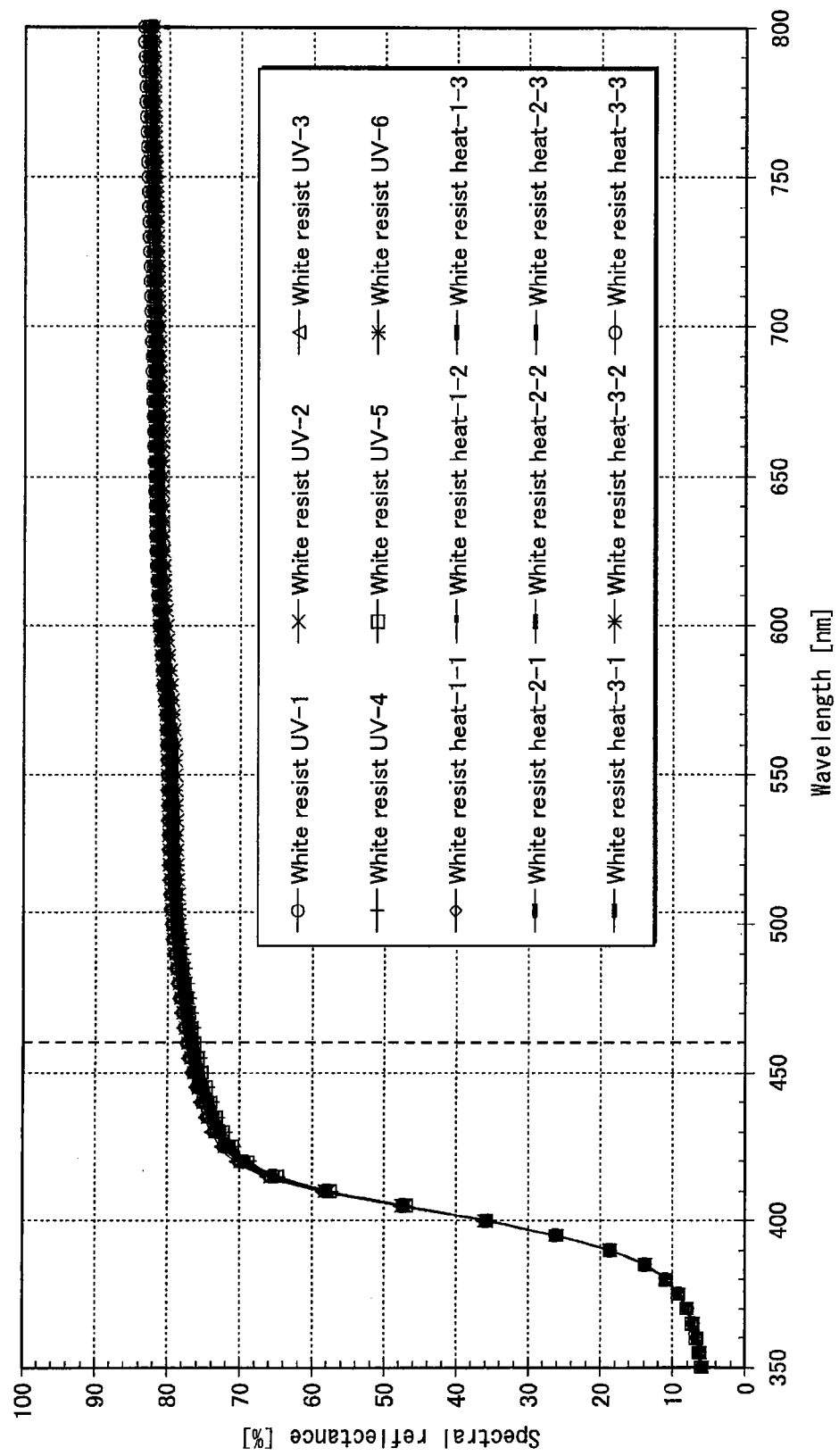
FIG. 5 is a graph showing spectral reflectance of a reflective material (white resist)
Figure 6:
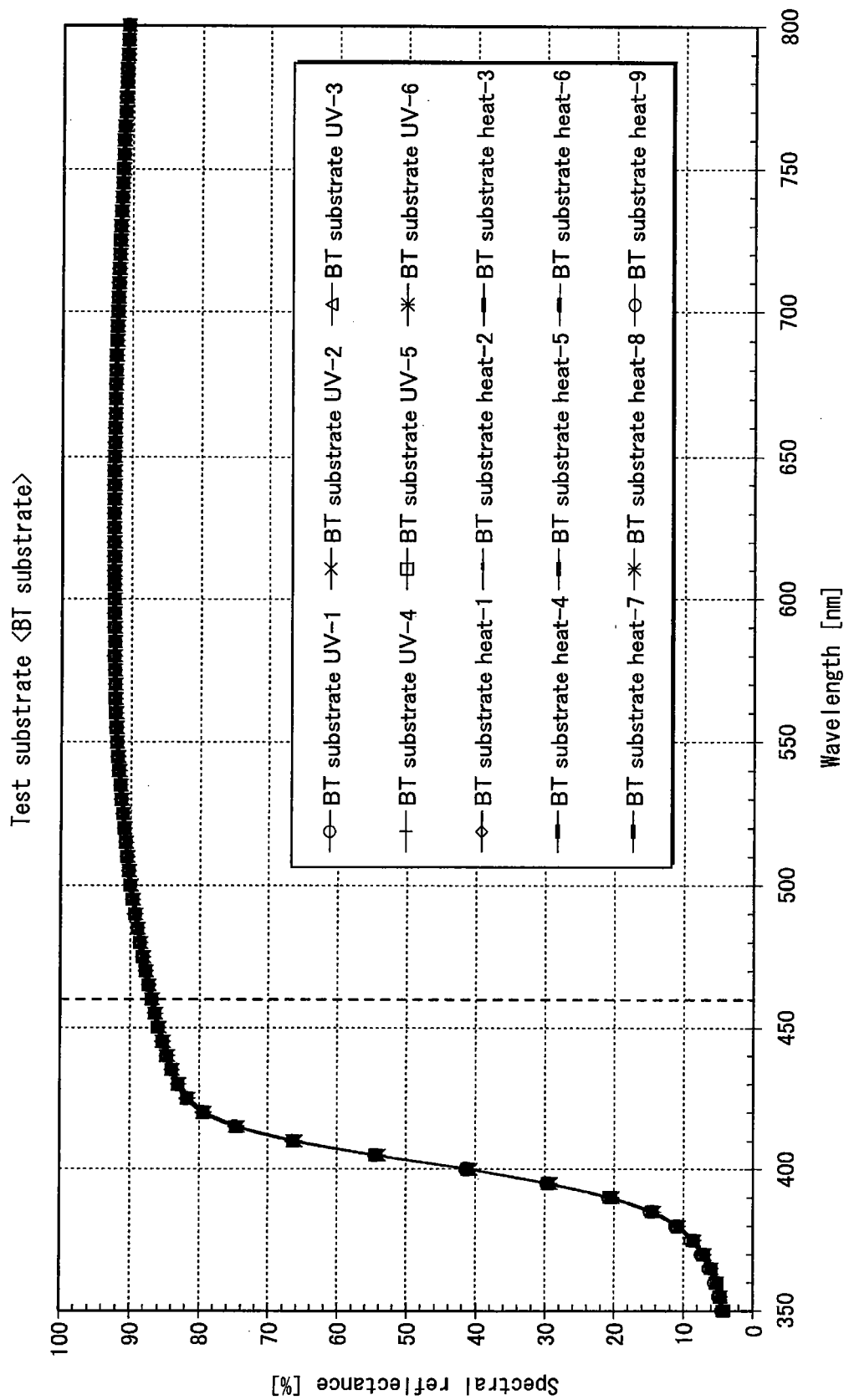
FIG. 6 is a graph showing spectral reflectance of a reflective material (BT substrate)
Figure 7:
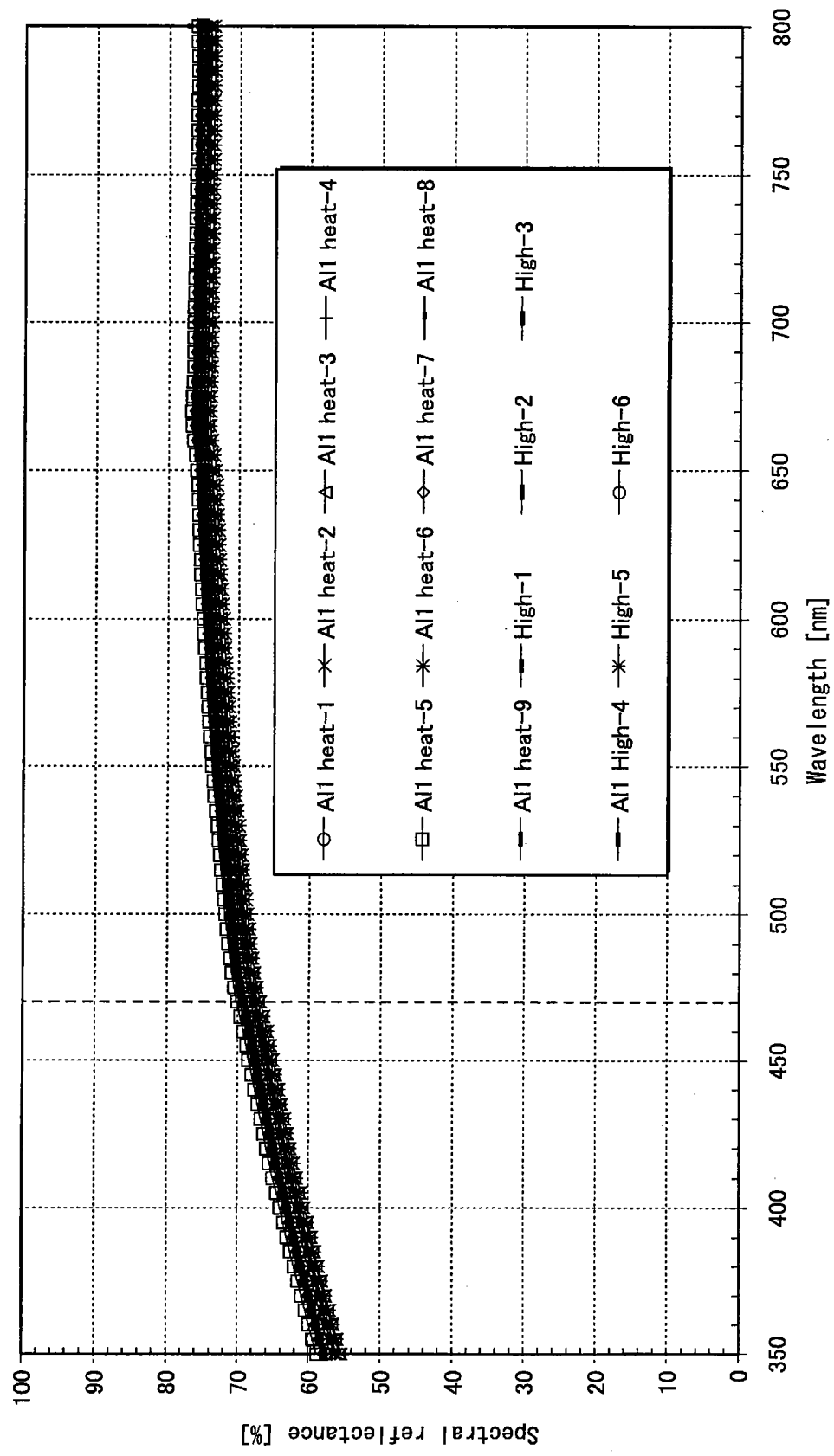
FIG. 7 is a graph showing spectral reflectance of a reflective material (Al with no surface roughness)
Figure 8:
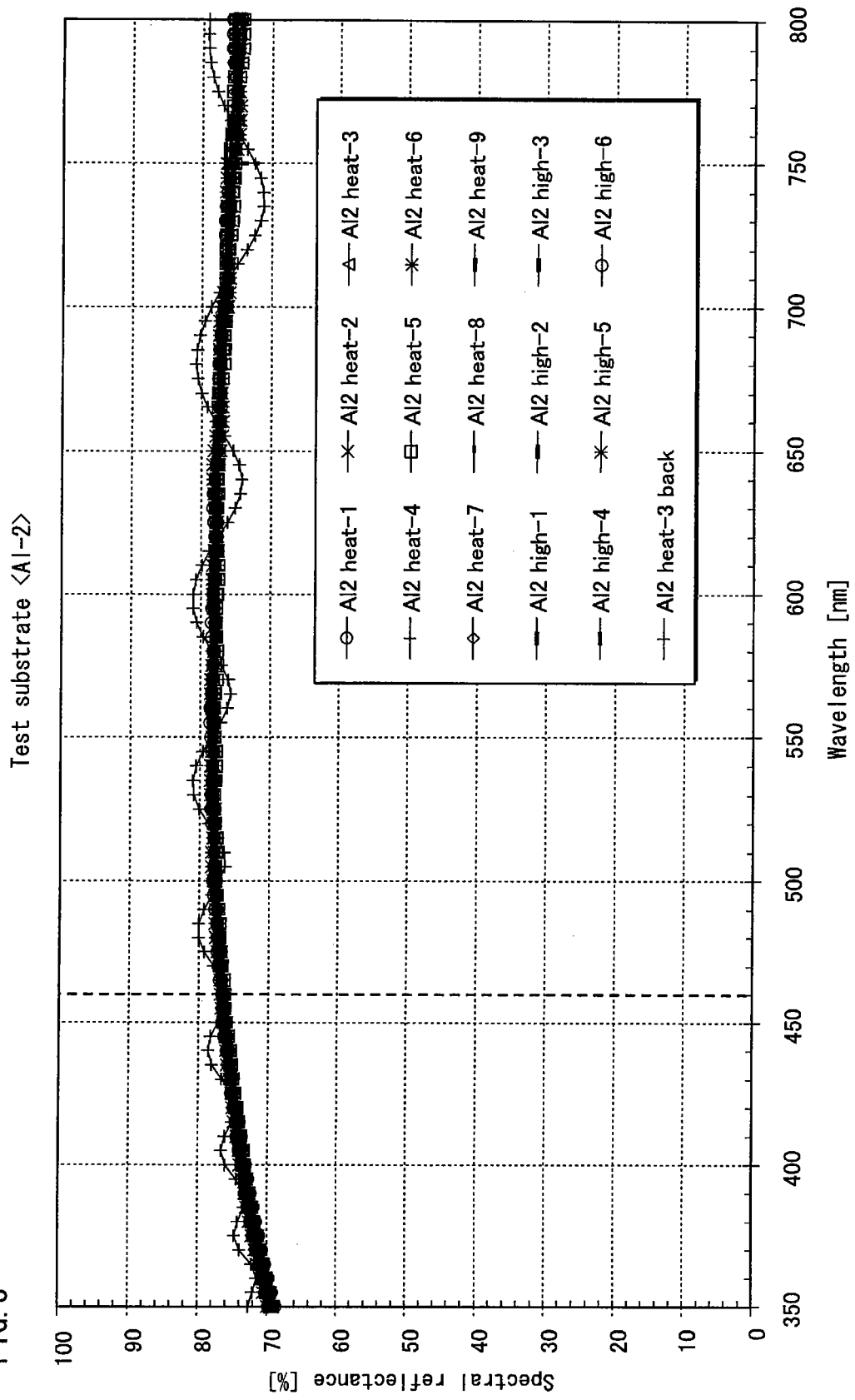
FIG. 8 is a graph showing spectral reflectance of a reflective material (Al with surface roughness)
Figure 9:
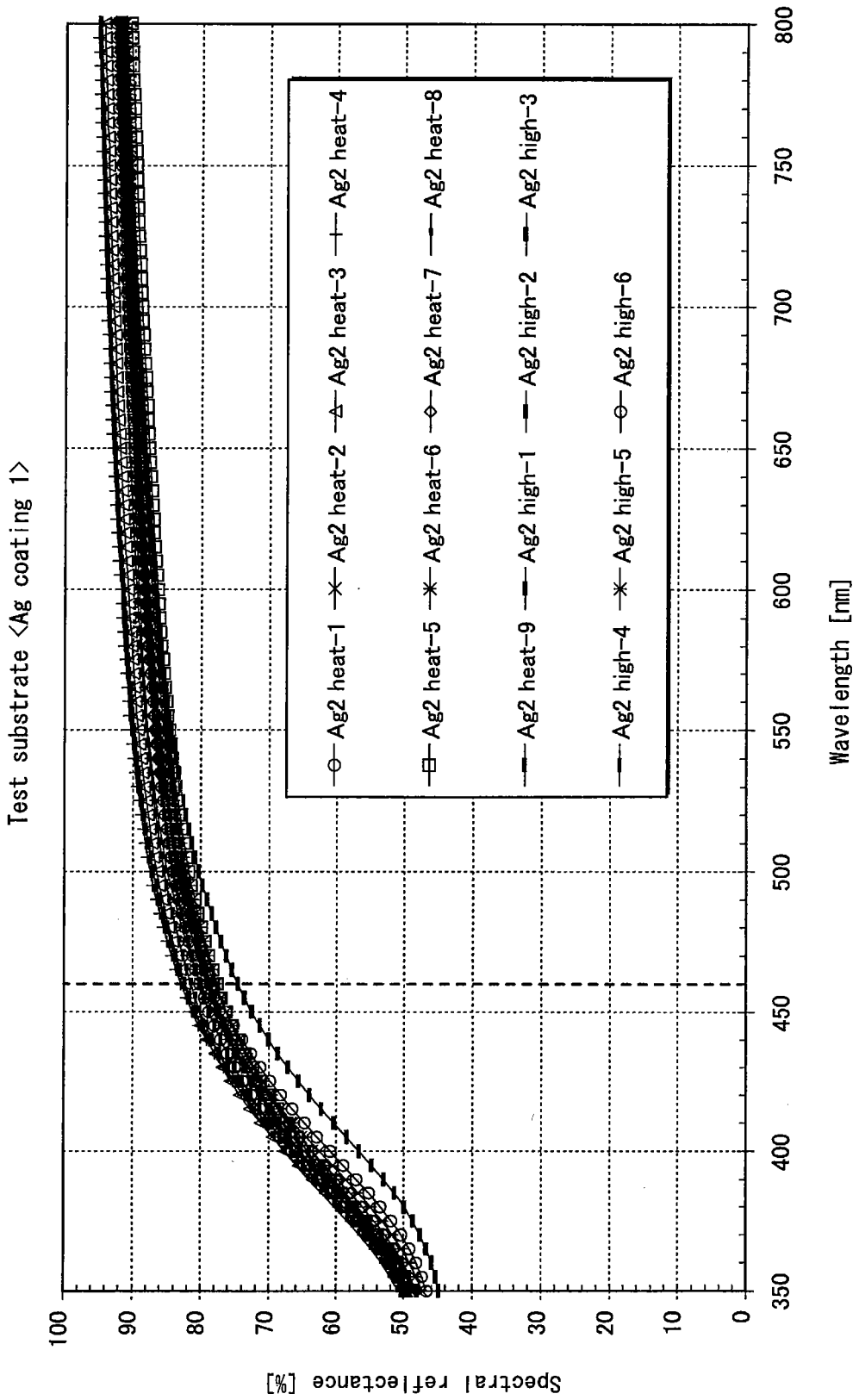
FIG. 9 is a graph showing spectral reflectance of a reflective material (Ag coating, Cu—Ni—Ag)
Figure 10:
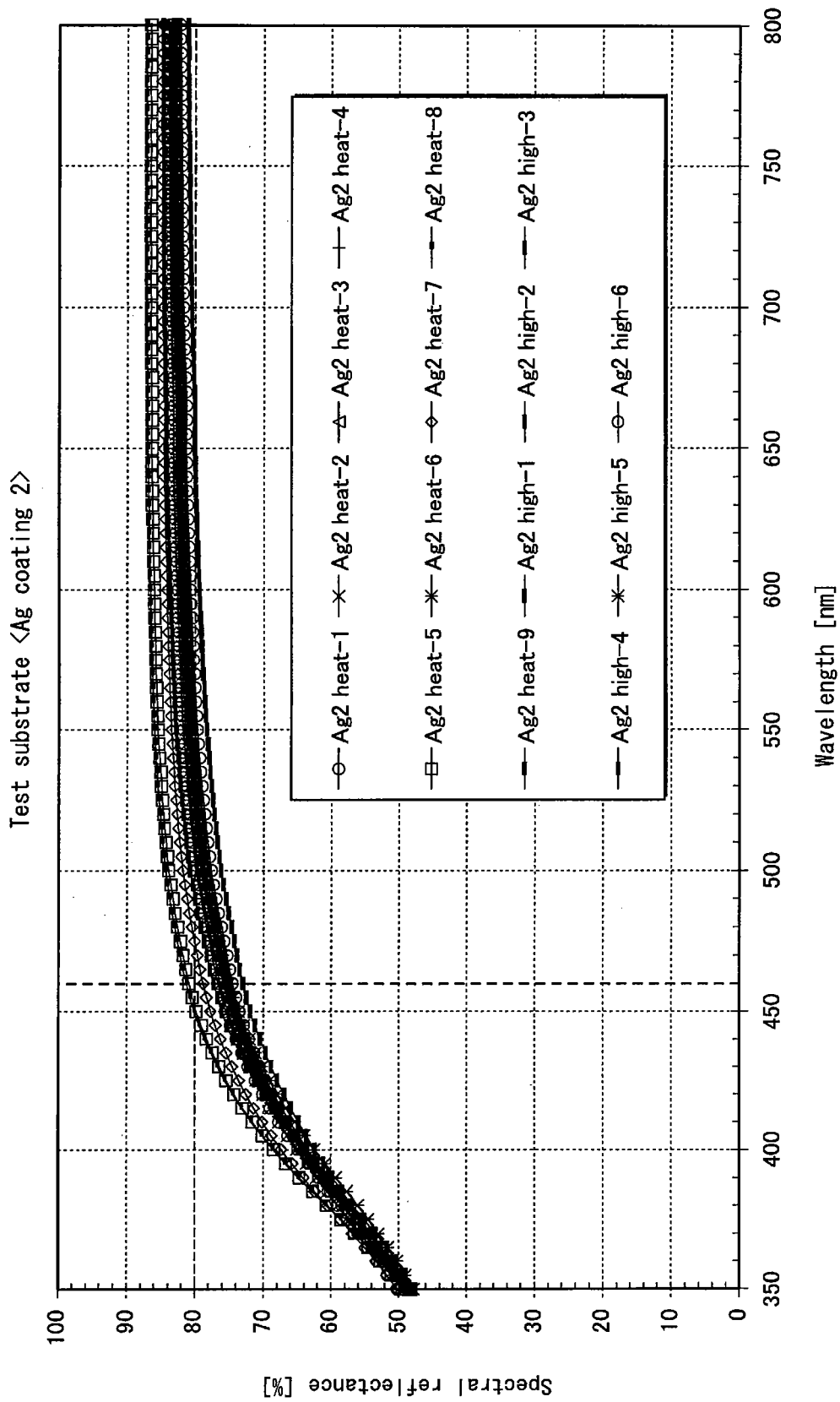
FIG. 10 is a graph showing spectral reflectance of a reflective material (Ag coating, Cu—Ag)
Figure 11:
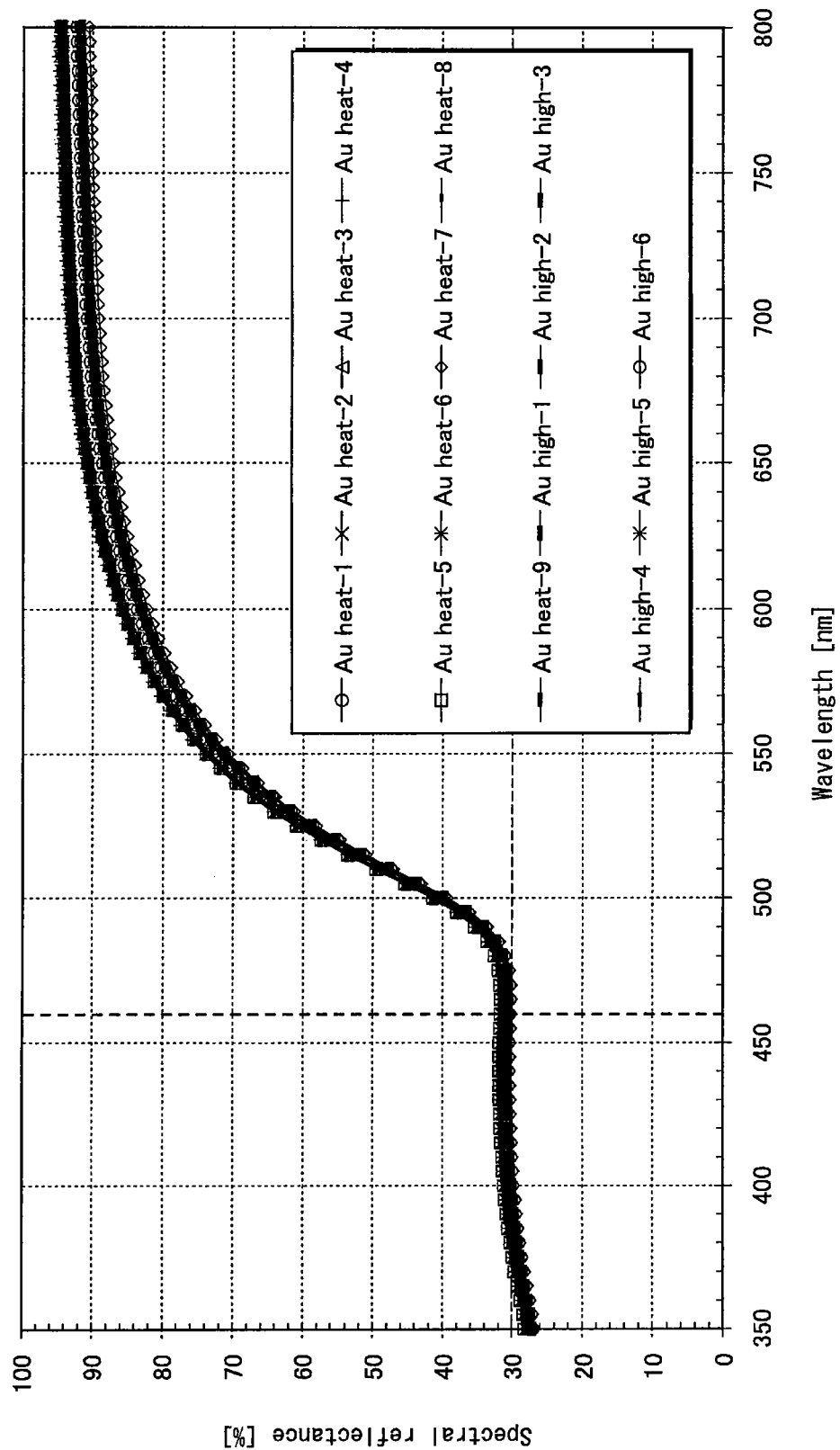
FIG. 11 is a graph showing spectral reflectance of a reflective material (Au coating)

The graphs of FIGS. 4-6 show that each of alumina, the white resist and the BT resin has high spectral reflectance of 80% or more in the wavelength region of visible light. However, the table of FIG. 12 shows that the spectral reflectance of alumina is not deteriorated by heat, whereas the spectral reflectances of the white resist and the BT resin are deteriorated by heat. The cause of this can be that alumina, which is one type of ceramic, is unlikely to be degraded by heat, whereas the white resist or the BT resin, which is one type of resins, is likely to be degraded by heat.

The measurement results show that if the reflective material of the mount substrate is made of ceramic, high efficiency of light emission can be achieved at the initial stage, and the efficiency of light emission can be kept high also after the thermal deterioration.

As above, the light source for illumination pertaining to the present invention is described based on the embodiment. However, the present invention is not limited to the above embodiment, and the following modifications can be made, for example.

Figure 13:
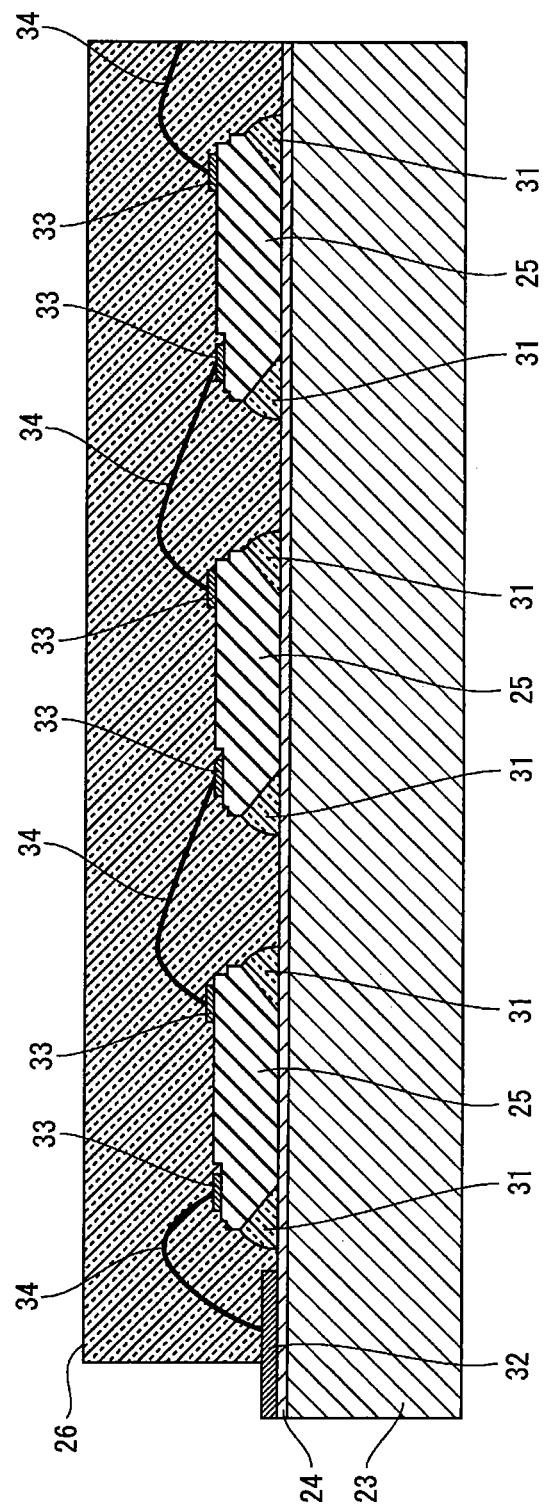
FIG. 13 is a cross-sectional view showing the structure of an LED module in accordance with a first modification of the present invention.

(1) According to the embodiment, the wiring pattern is formed on the upper surface of the mount substrate. However, the efficiency of light emission may be improved by minimizing the wiring pattern. For example, according to the LED module shown in FIG. 13, the adjacent LEDs 25 are directly connected with each other via the wire 34. Thus, the area of the wiring pattern for coating the ceramic layer 24 can be reduced, and the efficiency of light emission can be improved.

(2) According to the embodiment, the LED is described as an example of a light-emitting element. However, a light-emitting transistor, an organic EL, an inorganic EL, etc. are also applicable.

(3) According to the embodiment, the phosphor is described as a wavelength converting material. However, as long as a member contains a material that has a substance absorbing light with a certain wavelength and emitting light with a different wavelength, a semiconductor, a metal complex, an organic dye, a pigment, or the like is applicable.

(4) According to the embodiment, a silicone resin mold containing phosphor particles is described as a wavelength converter. However, a ceramic mold obtained by sintering phosphor particles is also applicable.

(5) According to the embodiment, white light is obtained by combining a blue LED and yellow phosphors. However, white light may be obtained by combining an ultraviolet LED and phosphors emitting three primary colors.

(6) According to the embodiment, a light source for illumination used as a substitute for a bulb is described. However, the present invention is not limited to this, and can be applied to a general light source for illumination. However, according to the light source for illumination used as a substitute for a bulb, the size of the heat sink is limited. Thus, compared with a general light source for illumination, the heat dissipation properties need to be more improved. Accordingly, the present invention is more effective when applied to a light source for illumination used instead of a bulb.

(7) If the ceramic layer is a porous layer, which is not particularly mentioned in the embodiment, the holes of the ceramic layer may be sealed.

(8) The ceramic layer may be coated not only on one surface but on the both surfaces of the metal substrate. Also, the ceramic layer may be coated on all the surfaces of the metal substrate including the both surfaces and the lateral surfaces of the metal substrate.

(9) Normally, the thermal expansion coefficient of a metal and that of ceramics are different from each other. Accordingly, if the temperature of the mount substrate increases due to the operation of the LED, the mount substrate may be warped because of the following reasons. When the temperature of the metal substrate increases, since the surface of the metal substrate is fixed to the ceramic layer, the surface of the metal substrate is unlikely to be expanded. Also, since the opposite surface of the metal substrate is not restricted, the opposite surface of the metal substrate is easily expanded. Since the warp of the mount substrate leads to the deterioration of the thermal contact with the heat sink, it is desirable to adopt the structure in which the warp does not readily occur despite the temperature rise.

Figure 14:
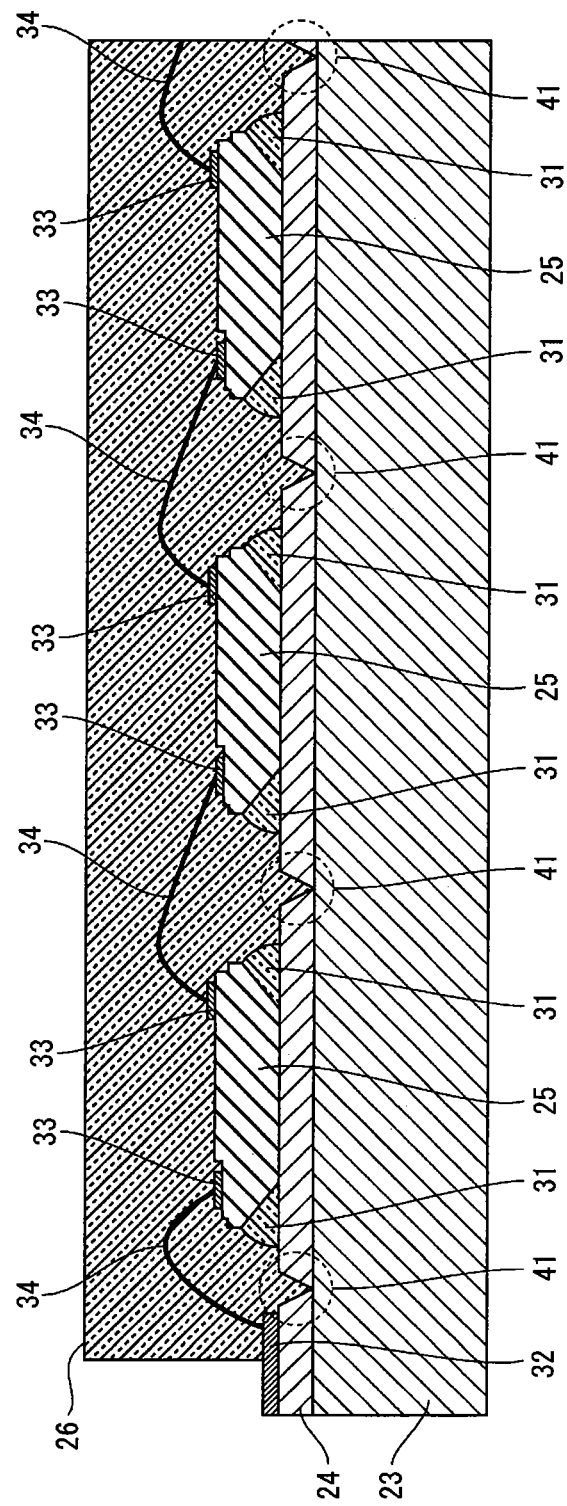
FIG. 14 is a cross-sectional view showing the structure of an LED module in accordance with a second modification of the present invention.

According to the mount substrate shown in FIG. 14, the surface of the metal substrate 23 is divided into a plurality of areas, and the ceramic layer 24 is provided for each area. With this structure, the ceramic layer is less fixed to the surface of the metal substrate, which allows the surface of the metal substrate to be thermally expanded to some extent. Thus, the warp of the mount substrate can be suppressed. Note that the surface may be divided into areas each having the size that allows a single LED to be mounted thereon, or that allows a plurality of LEDs to be mounted thereon. Also, this structure can be realized as follows, for example. The ceramic layer is formed on all the surfaces of the metal substrate 23, and grooves 41 are formed at predetermined intervals on the ceramic layer. The grooves 41 can be formed by the chemical processing such as etching or the mechanical processing such as grinding.

Figure 15:
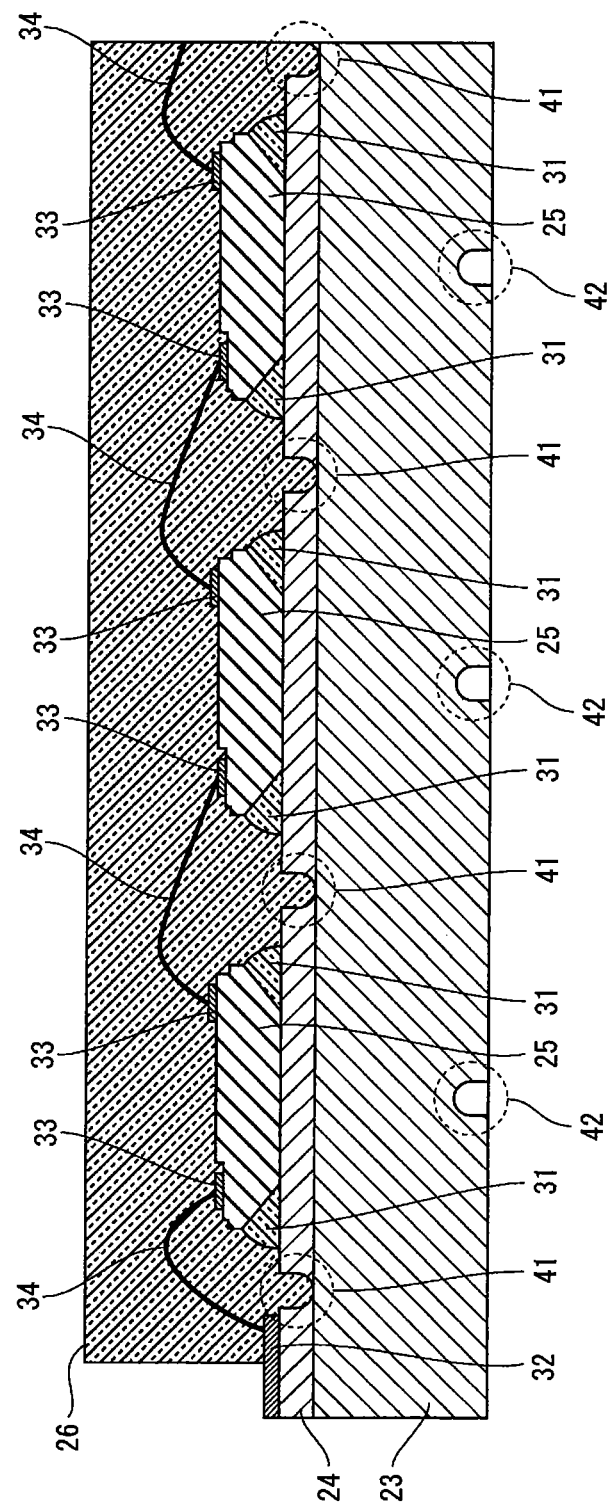
FIG. 15 is a cross-sectional view showing the structure of an LED module in accordance with a third modification of the present invention.

According to the mount substrate shown in FIG. 15, the grooves 42 are formed on the opposite surface of metal substrate 23 at predetermined intervals. With this structure, the expansion of the opposite surface of the metal substrate 23 is absorbed by the grooves 42 to some extent. Accordingly, the difference in the expansion between the surface and the opposite surface of the metal substrate 23 can be reduced, which consequently suppresses the warp of the mount substrate. Note that according to the mount substrate shown in FIG. 15, the bottom of each of the grooves 41 and 42 has a curvature (i.e.

the cross section of each of the grooves 41 and 42 is in the shape of the letter U). This can keep the metal substrate 23 to be cracked from each of the grooves 41 and 42 even when the thermal expansion and the thermal shrinkage are repeated. Furthermore, the grooves 42 are displaced not to oppose the grooves 41. This can lower the possibility that the cracks extend from one surface to the opposite surface of the metal substrate 23 even when the cracks occurs from the grooves 41 or 42. Consequently, the breakage of the mount substrate caused by the crack can be less likely to occur.

Figure 16A:
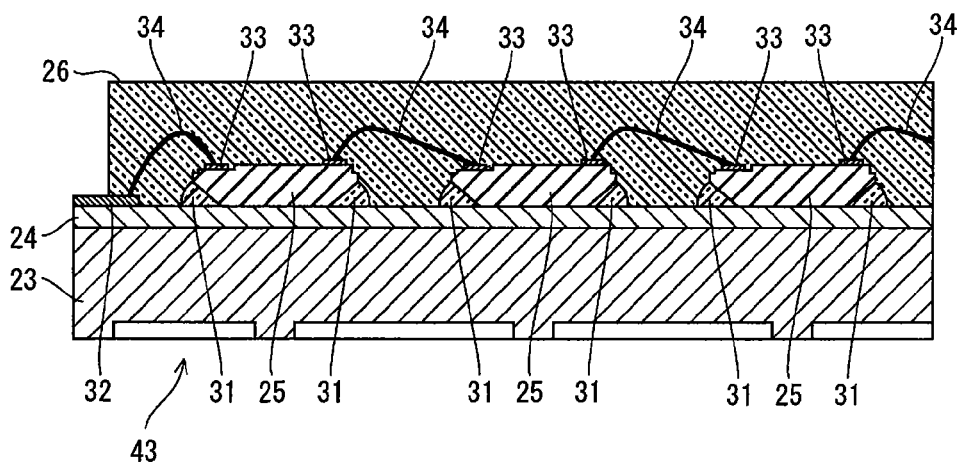
FIGS. 16A and 16B each show the structure of an LED module in accordance with a fourth modification of the present invention, FIG. 16A being a cross-sectional view of the LED module taken along the A-A line, and FIG. 16B being a view of the LED module seen from the opposite surface of the metal substrate.
Figure 16B:
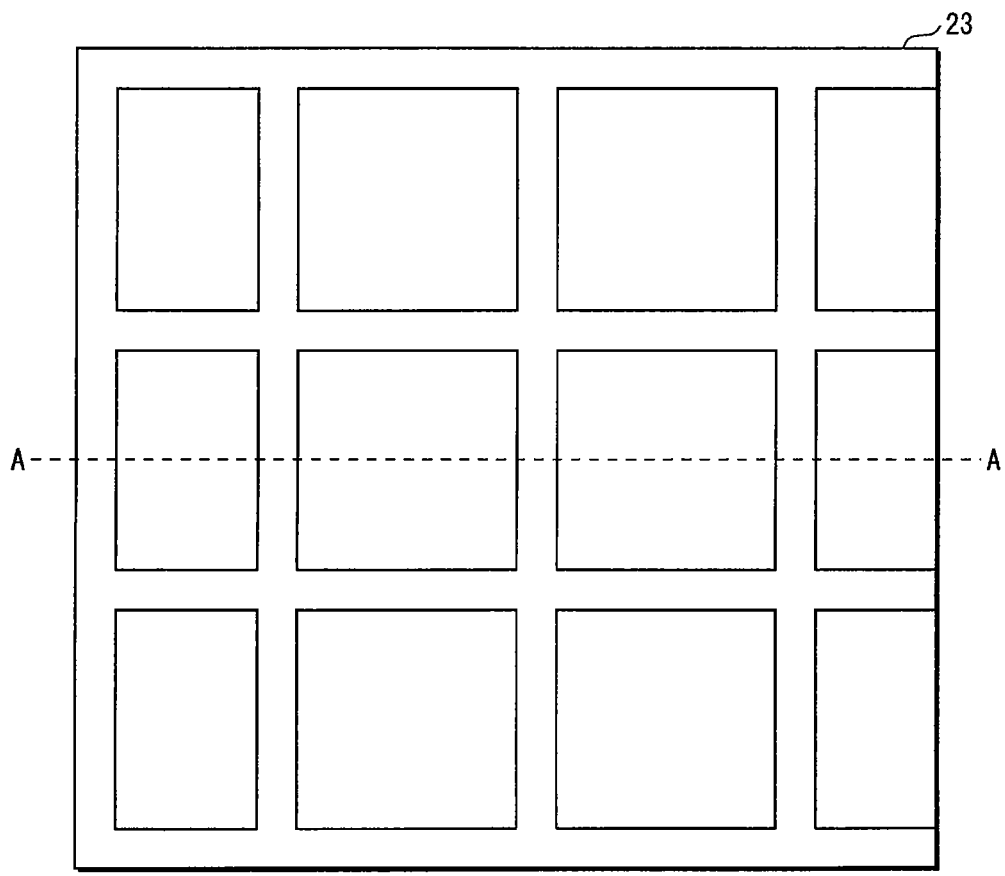

According to the mount substrate shown in FIG. 16, a beam structure 43 is formed in which beams are formed in a grid pattern on the opposite surface of the metal substrate 23. Similarly to the grooves 42 in FIG. 15, the expansion on the opposite surface of the metal substrate 23 is absorbed by the recessed portion to some extent. This can suppress the warp of the mount substrate. Also, as shown in FIG. 16, since the LED is mounted at a position that corresponds to corresponding one of the beams, which minimize the length of the thermal path from the LED to the heat sink. Thus, if the beam structure is employed, the deterioration of the heat dissipation properties can be suppressed. Also, this structure can be realized, for example, by forming recessed portions on the opposite surface of the metal substrate 23 at predetermined intervals using the chemical processing such as etching.

INDUSTRIAL APPLICABILITY

The present invention can be widely used for general illumination.

REFERENCE SIGNS LIST 1 light source for illumination
11 case
12 power circuit
13 printed wiring board
14 electronic component
15 Edison base
16 heat sink
17 globe
21 mount substrate
22 light-emitting part
23 metal substrate
24 ceramic layer
25 LED
26 silicone resin mold
27 ceramic particle
31 joining member
32 wiring pattern
33 pad
34 wire
41, 42 groove
43 beam structure

The invention claimed is:

1. A light source for illumination comprising:
a mount substrate including a metal substrate and a ceramic layer that coats the metal substrate;
a light-emitting element mounted on the mount substrate; and
a wavelength converting member operable to convert, wavelength of light emitted from the light-emitting element, wherein
the ceramic layer contains light-transmissive ceramic particles or highly reflective ceramic particles,
the metal substrate and the ceramic layer are bonded with each other without an adhesive therebetween by interatomic force between metal atoms of the metal substrate and the ceramic particles of the ceramic layer,
the ceramic layer has grooves for dividing the ceramic layer into a plurality of areas and
adjacent areas of the ceramic layer are separated from each other by a groove formed therebetween.

2. The light source for illumination of claim 1, wherein
the ceramic layer is thinner than the metal substrate,
the ceramic layer ranges between 10 µm and 200 µm, inclusive, in thickness, and
the metal substrate ranges between 0.1 mm and 5.0 mm, inclusive, in thickness.

3. The light source for illumination of claim 1, wherein,
spectral reflectance of the mount substrate in a wavelength region of the light emitted from the light-emitting element is 70% or more.

4. The light source for illumination of claim 1, wherein
the ceramic layer is a film thermally sprayed with the light-transmissive ceramic particles or the highly reflective ceramic particles, or a ceramic sheet.

5. The light source for illumination of claim 1, wherein
the ceramic layer coats both opposing surfaces or all surfaces of the metal substrate.

6. The light source for illumination of claim 1, further comprising:
a heat sink member having surface contact with the mount substrate; and
a case fixing the heat sink member, and having a base protruding therefrom and a power circuit contained therein, the power circuit supplying power supplied via the base to the light-emitting element.

7. The light source for illumination of claim 1, wherein
grooves or recessed portions are formed at predetermined intervals on a surface of the metal substrate not coated with the ceramic layer.

8. The light source for illumination of claim 3, wherein
the spectral reflectance of the mount substrate in a wavelength region between 425 nm and 800 nm, inclusive, is initially 80% or more.

9. The light source for illumination of claim 3, wherein
in both thermal deterioration tests in which a temperature is kept at 180° C. and 215° C. for an hour, an initial value of the spectral reflectance remains unchanged.

10. The light source for illumination of claim 1, wherein
the metal substrate has a first surface coated with the ceramic layer and a second surface opposing the first surface, and
grooves are formed at predetermined intervals on the second surface of the metal substrate.

11. The light source for illumination of claim 10, wherein
each groove on the second surface of the metal substrate is displaced from a position of corresponding one of the grooves on the ceramic layer.

12. The light source for illumination of claim 10, wherein
a cross section of each groove is in a shape of letter U.

13. The light source for illumination of claim 1, wherein,
the metal substrate has a first surface coated with the ceramic layer and a second, surface opposing the first surface, and
beams are formed in a grid pattern on the second surface of the metal substrate.

14. The light source for illumination of claim 13, wherein
the light-emitting element is mounted at a position on a surface of the mount substrate, the position corresponding to corresponding one of the beams on the second surface of the metal substrate.

15. The light source for illumination of claim 1, wherein
the light-emitting element is tapered toward a bottom thereof.

* * * * *